US011199582B2

(12) United States Patent
Flateau, Jr. et al.

(10) Patent No.: US 11,199,582 B2
(45) Date of Patent: Dec. 14, 2021

(54) IMPLEMENTING A JTAG DEVICE CHAIN IN MULTI-DIE INTEGRATED CIRCUIT

(71) Applicant: XILINX, INC., San Jose, CA (US)

(72) Inventors: Roger D. Flateau, Jr., San Jose, CA (US); Srinu Sunkara, Campbell, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/841,564

(22) Filed: Apr. 6, 2020

(65) Prior Publication Data
US 2021/0311115 A1 Oct. 7, 2021

(51) Int. Cl.
*G01R 31/3177* (2006.01)
*G06F 9/30* (2018.01)
*G01R 31/317* (2006.01)
*G08G 1/0968* (2006.01)

(52) U.S. Cl.
CPC ... *G01R 31/3177* (2013.01); *G01R 31/31701* (2013.01); *G01R 31/31712* (2013.01); *G01R 31/31727* (2013.01); *G06F 9/30145* (2013.01); *G08G 1/096805* (2013.01); *G08G 1/096811* (2013.01); *G08G 1/096816* (2013.01); *G08G 1/096822* (2013.01)

(58) Field of Classification Search
None
See application file for complete search history.

(56) References Cited

U.S. PATENT DOCUMENTS

| 7,818,640 | B1 | 10/2010 | Lerner |
| 8,549,368 | B1 | 10/2013 | Deogharia et al. |
| 2009/0193306 | A1 | 7/2009 | Chakraborty et al. |
| 2013/0139015 | A1* | 5/2013 | Vaccaro ......... G01R 31/318558 |
| | | | 714/727 |
| 2017/0329728 | A1 | 11/2017 | Karri et al. |

* cited by examiner

*Primary Examiner* — Guerrier Merant
(74) *Attorney, Agent, or Firm* — Patterson + Sheridan, LLP

(57) ABSTRACT

An example integrated circuit (IC) die in a multi-die IC package, the multi-die IC package having a test access port (TAP) comprising a test data input (TDI), test data output (TDO), test clock (TCK), and test mode select (TMS), is described. The IC die includes a Joint Test Action Group (JTAG) controller having a JTAG interface that includes a TDI, a TDO, a TCK, and a TMS, a first output coupled to first routing in the multi-die IC package, a first input coupled to the first routing or to second routing in the multi-die IC package, a master return path coupled to the first input, and a wrapper circuit configured to couple the TDI of the TAP to the TDI of the JTAG controller, and selectively couple, in response to a first control signal, the TDO of the TAP to either the master return path or the TDO of the JTAG controller.

20 Claims, 13 Drawing Sheets

IMPLEMENTING A JTAG DEVICE CHAIN IN MULTI-DIE INTEGRATED CIRCUIT

TECHNICAL FIELD

Examples of the present disclosure generally relate to electronic circuits and, in particular, to implementing a JTAG device chain in a multi-die integrated circuit.

BACKGROUND

The JTAG interface is a well-known interface established by the Joint Test Action Group (JTAG), The JTAG interface is incorporated into IEEE 1149.1 (referred to herein as the "JTAG standard"), which is a standard defining boundary scan test logic for integrated circuits (ICs). The JTAG interface provides a 4-pin interface that uses serial data shifting to perform a multitude of test and debug functions on devices. The JTAG standard includes various rules that define how a JTAG controller should operate, such as the IDCODE register is 32-bits and the BYPASS instruction inserts a one register delay on the shift chain. The standard further specifies that the JTAG controller operates in two phases. First, the instruction phase, where an instruction is serially shifted into the controller. Second, the data phase, where data associated with the active instruction is shifted into the selected JTAG data register. The data register length varies by instruction, but the instruction register length should remain constant.

The JTAG standard also includes methods for chaining multiple JTAG controllers together. One technique includes daisy chaining each JTAG controller across multiple devices so that the output of one is coupled to the input of the next, where the JTAG input is on the first device and the JTAG output is on the last device. This technique allows for creation of one long serial shift chain on a circuit board having multiple devices. The daisy chain technique was developed for connecting multiple chips on a board. Consider, however, a multi-die integrated circuit (IC) package having multiple devices with JTAG controllers coupled in daisy chain fashion as described above. From the outside, the JTAG network in the IC package is designed to appear as a single JTAG controller to the user. To accomplish this and maintain compliance with the JTAG standard, some sacrifices are necessary that affect JTAG performance. For example, as noted above, the BYPASS instruction requires that only a single delay be set between the data input and the data output. However, the data input is to the first device in the chain and the data output is from the last device in the chain. To comply with the JTAG standard, the multi-die IC package must include a long wire that routes through all die therein from first to last. Such a long wire limits the maximum frequency at which the JTAG interface can operate for a multi-die package.

SUMMARY

Techniques for implementing a JTAG device chain in a multi-die integrated circuit are described. In an example, an integrated circuit (IC) package having a test access port (TAP) comprising a test data input (TDI), test data output (TDO), test clock (TCK), and test mode select (TMS) is described. The IC package includes: a master integrated circuit (IC) die including a master Joint Test Action Group (JTAG) controller and a master wrapper circuit coupled to the master JTAG controller; a slave IC die including a slave JTAG controller and a slave wrapper circuit coupled to the slave JTAG controller; a forwarding path coupling an output of the master wrapper circuit to a first input of the slave wrapper circuit; and a master return path coupling a first output of the slave wrapper circuit to an input of the master wrapper circuit; wherein the master wrapper circuit couples the TDI of the TAP to a TDI of the master JTAG controller, and selectively couples, in response to a first control signal, the TDO of the TAP to either the master return path or a TDO of the master JTAG controller.

In another example, an integrated circuit (IC) die in a multi-die IC package, the multi-die IC package having a test access port (TAP) comprising a test data input (TDI), test data output (TDO), test clock (TCK), and test mode select (TMS), is described. The IC die includes: a Joint Test Action Group (JTAG) controller having a JTAG interface that includes a TDI, a TDO, a TCK, and a TMS; a first output coupled to first routing in the multi-die IC package; a first input coupled to the first routing or to second routing in the multi-die IC package; a master return path coupled to the first input; and a wrapper circuit configured to couple the TDI of the TAP to the TDI of the JTAG controller, and selectively couple, in response to a first control signal, the TDO of the TAP to either the master return path or the TDO of the JTAG controller.

In another example, a method of testing a multi-die integrated circuit (IC) package having a test access port (TAP) comprising a test data input (TDI), test data output (TDO), test clock (TCK), and test mode select (TMS), the multi-die IC package further including a master IC die and a slave IC die, is described. The method includes: coupling, by a master wrapper circuit in the master IC die, in response to a first control signal output by a first control circuit in the master IC die, the TDO of the TAP to a master return path from the slave IC die to the master IC die; receiving an instruction at a master JTAG controller in the master IC die through the TDI of the TAP, and at a slave JTAG controller in the slave IC die through a forwarding path from the master IC die to the slave IC die; determining, by the first control circuit, that the instruction requires data to be routed only through the master IC die and changing state of the first control signal; and coupling, by the master wrapper circuit, in response to the first control signal output by the first control circuit, the TDO of the TAP to a TDO of the master JTAG controller.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
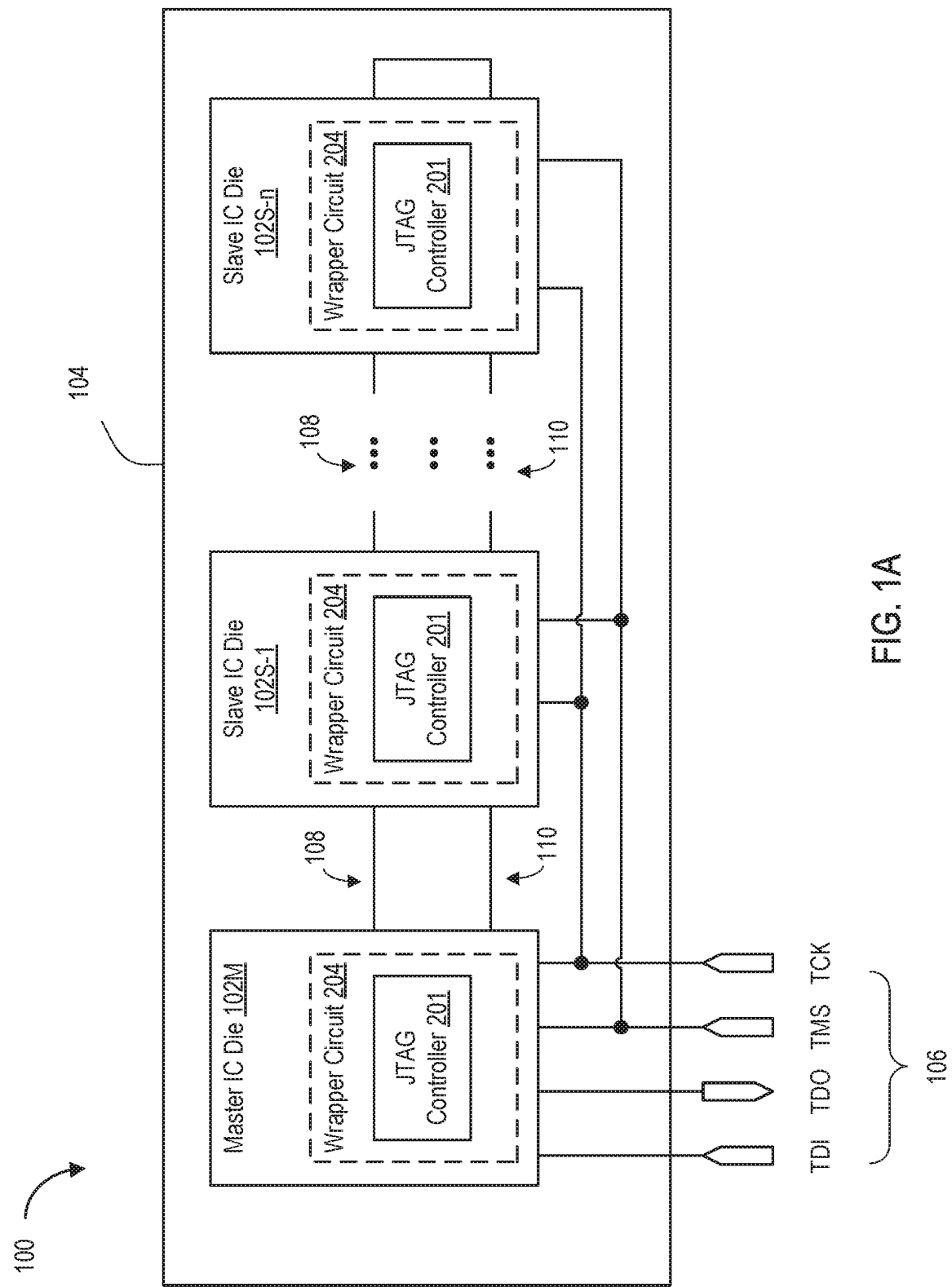
FIG. 1A is a block diagram depicting an integrated circuit (IC) device according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with an example is not necessarily limited to that example and can be practiced in any other examples even if not so illustrated or if not so explicitly described.

Techniques for implementing a JTAG device chain in a multi-die integrated circuit are described. In examples, the JTAG controllers on master and slave IC die in the package are daisy chained together through the package (e.g., through an interposer). The primary JTAG interface, the four-signal interface exposed to the user, is only active on the master IC die. The serial shift chain starts in the master and propagates to the first slave. The connection from master to slave is implemented using a JTAG interface that connects through the package (e.g., through the interposer). This connection continues from slave to slave until the last slave. The package configures the last slave to loop the chain to a master return path. The master return path is used to drive the JTAG data back to the master die in order to send it out the TDO of the JTAG interface of the package. In examples, the return path on each die has a rebuffering element to improve performance of the JTAG interface. These and further aspects of the disclosed techniques can be understood with reference to the description of the drawings.

Figure 6A:
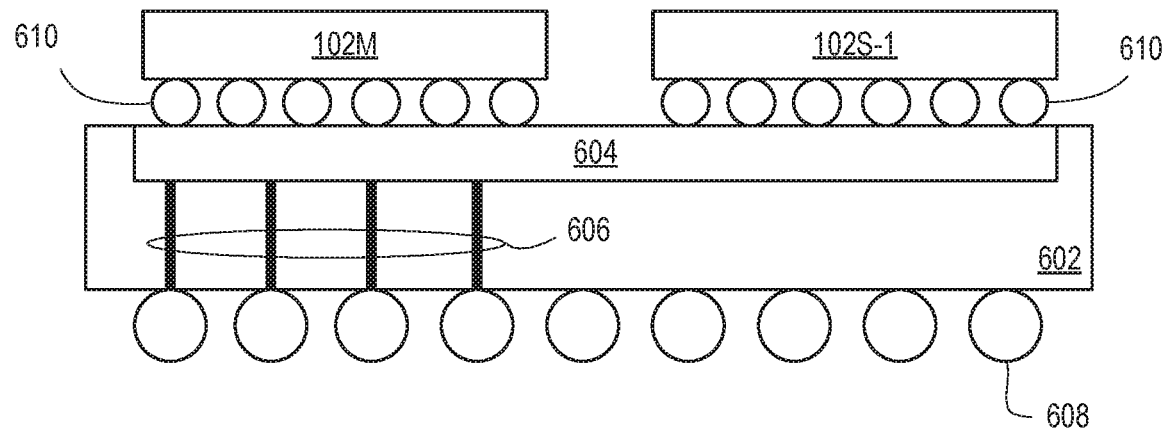
FIG. 6A illustrates a side-view of a multi-die IC package according to an example.
Figure 6B:
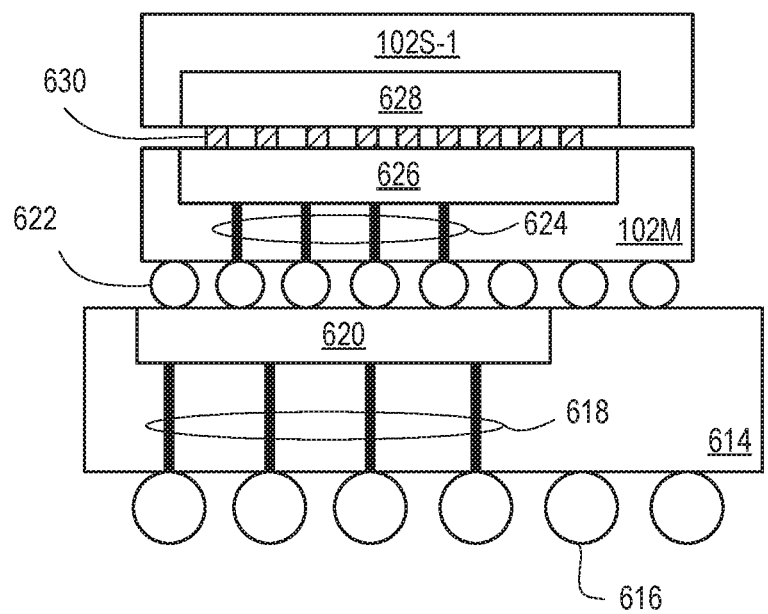
FIG. 6B illustrates a side-vide of a multi-die IC package according to another example.

FIG. 1A is a block diagram depicting a multi-die integrated circuit (IC) device 100 according to an example. The multi-die IC device 100 includes a master IC die 102M and at least one slave IC die 102S-1 ... 102S-n, where n is an integer greater than zero (collectively slave dies 102S). The master IC die 102M and the slave IC die(s) 102S are collectively referred to as IC dies 102. The master IC 102M and the slave IC die(s) 102S are disposed in a multi-die IC package 104. In examples, the IC dies 102 are disposed side-by-side on an interposer (sometimes referred to as a 2.5D package). In other examples, the IC dies are disposed in a three-dimensional stack, one on top of another (referred to as a 3D package). The coupling of master IC die 102M with the slave IC die(s) 102S described herein does not presume any specific structure of the IC dies 102 within the multi-die IC package 104. FIGS. 6A and 6B described below show two example structures of the multi-die IC package 104 in which the techniques described herein for connecting JTAG devices can be employed.

The multi-die IC package 104 includes a test access port (TAP) 106 comprising a test data input (TDI), a test data output (TDO), a test mode select (TMS), and a test clock (TCK). The TDI, TDO, TMS, and TCK of the TAP 106 comprise external contacts of the multi-die IC package 104 and are accessible by an external tester. Each of the master IC die 102M and the slave IC die(s) 102S include a JTAG controller 201 and a wrapper circuit 204 coupled to the JTAG controller 201. The TMS and the TCK of the TAP 106 are coupled to a TMS and a TCK, respectively, of each JTAG controller in the IC dies 102. Together with control logic, the wrapper circuit 204 in each IC die 102 configures the IC die 102 as either a master or a slave. In the example, the master IC die 102M is configured as a master. Together with control logic, the wrapper circuit 204 in each IC die 102 configures the IC die 102 to route JTAG input to the same die or to a next die in the chain. In the example, the master IC die 102M is configured in the master configuration, and each slave IC die 102S is configured in the slave configuration.

In the master configuration, within the master IC die 102M, the wrapper circuit 204 couples the TDI to the JTAG controller 201. The master IC die 102M dynamically operates in either the same die configuration or the next die configuration depending on the JTAG instruction. In the same die configuration, the wrapper circuit 204 in the master IC die 102M couples the TDO of the JTAG controller 201 to the TDO of the TAP 106. Thus, in the same die configuration, JTAG data only propagates through the master IC die 102M during the data phase. During the instruction phase, data propagates through all IC die 102 regardless of same/next die configuration. In the next die configuration, the wrapper circuit 204 in the master die 102M couples the TDO of the JTAG controller 201 to a forwarding path 108 that serially couples each slave IC die 102S to the master IC die 102M. Thus, in the next die configuration, JTAG data propagates from the master IC die 102M to the slave IC die 102S-1.

In the slave configuration, the wrapper circuit 204 in each slave IC die 102S couples the forwarding path 108 to the TDI of its respective JTAG controller 201. Further, each slave IC die 102S operates in the next die configuration. In the next die configuration, the wrapper circuit 204 in each slave IC die 102S couples the TDO of its respective JTAG controller 201 to the forwarding path 108. Thus, JTAG data propagates from the master IC die 102M serially through each slave IC die 102S until being consumed by the slave IC die 102S-n.

A master return path 110 serially couples each slave IC die 102S to the master IC die 102M. The multi-die IC package 104 is configured to couple the forwarding path 108 to the master return path 110 after the slave IC die 102S-n. In the next die configuration, the wrapper circuits 204 in the slave IC dies 102S function to form the master return path 110 to the master IC die 102M. In the next die configuration, the wrapper circuit 204 in the master IC die 102M couples the master return path 110 to the TDO of the TAP 106. This allows JTAG data to be shifted in through the TDI of the TAP 106 to each IC die 102 and back out through the TDO of the TAP 106. As discussed below, the master IC die 102M can be configured in the same die configuration in cases where the instruction requirements dictate only the master IC die 102M be connected to the TAP 106 (e.g., for BYPASS or IDCODE instructions). The master IC die 102M can be configured in the next die configuration in cases where the instruction requirements dictate all IC die 102 be connected to the TAP 106 (e.g., for EXTEST and SAMPLE/PRELOAD instructions).

Figure 1B:
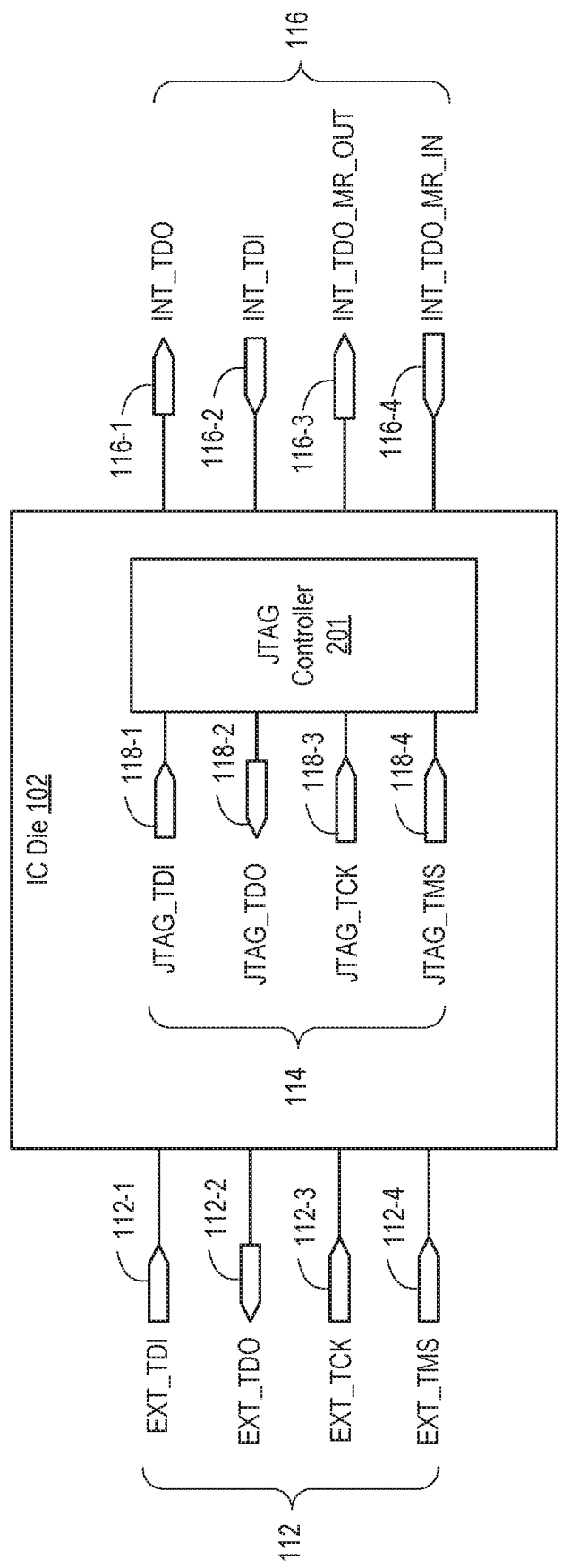
FIG. 1B is a block diagram depicting different signal interfaces of an IC die according to an example.

FIG. 1B is a block diagram depicting different signal interfaces of an IC die 102 according to an example. The IC die 102 includes an interface 112 comprising four contacts EXT_TDI, EXT_TDO, EXT_TCK, and EXT_TMS respectively designated by contacts 112-1 through 112-4. The contacts 112-3 and 112-4 of the interface 112 are coupled to the TCK and TMS of the TAP 106, respectively (e.g., EXT_TCK receives TCK and EXT_TMS receives TMS). If the IC die 102 is a master, the contacts 112-1 and 112-2 of the interface 112 are coupled to the TDI and TDO of the TAP 106, respectively (e.g., EXT_TDI receives TDI and EXT_TDO supplies TDO). If the IC die 102 is a slave, the contacts 112-1 and 112-2 are unconnected (e.g., high-impedance).

The IC die 102 includes an interface 116 comprising four contacts INT_TDO, INT_TDI, INT_TDO_MR_OUT, and INT_TDO_MR_IN respectively designated by contacts 116-1 through 116-4. The interface 116 is not exposed outside the multi-die IC package 104. Rather, the interface 116 is only coupled to routing disposed inside the multi-die IC package 104.

The JTAG controller 201 includes an interface 114 comprising JTAG_TDI, JTAG_TDO, JTAG_TCK, and JTAG_TMS respectively designated by contacts 118-1 through 118-4. The wrapper circuit 204 in the IC die 102 (shown in FIG. 1A) couples EXT_TCK and EXT_TMS to JTAG_TCK and JTAG_TMS, respectively. That is, the clock and mode select signals pass through the wrapper circuit 204 to the JTAG controller 201. The wrapper circuit 204 selectively couples JTAG_TDI and JTAG_TDO to the interface 112 and the interface 116 depending on the master/slave and same/next configurations.

Figure 2:
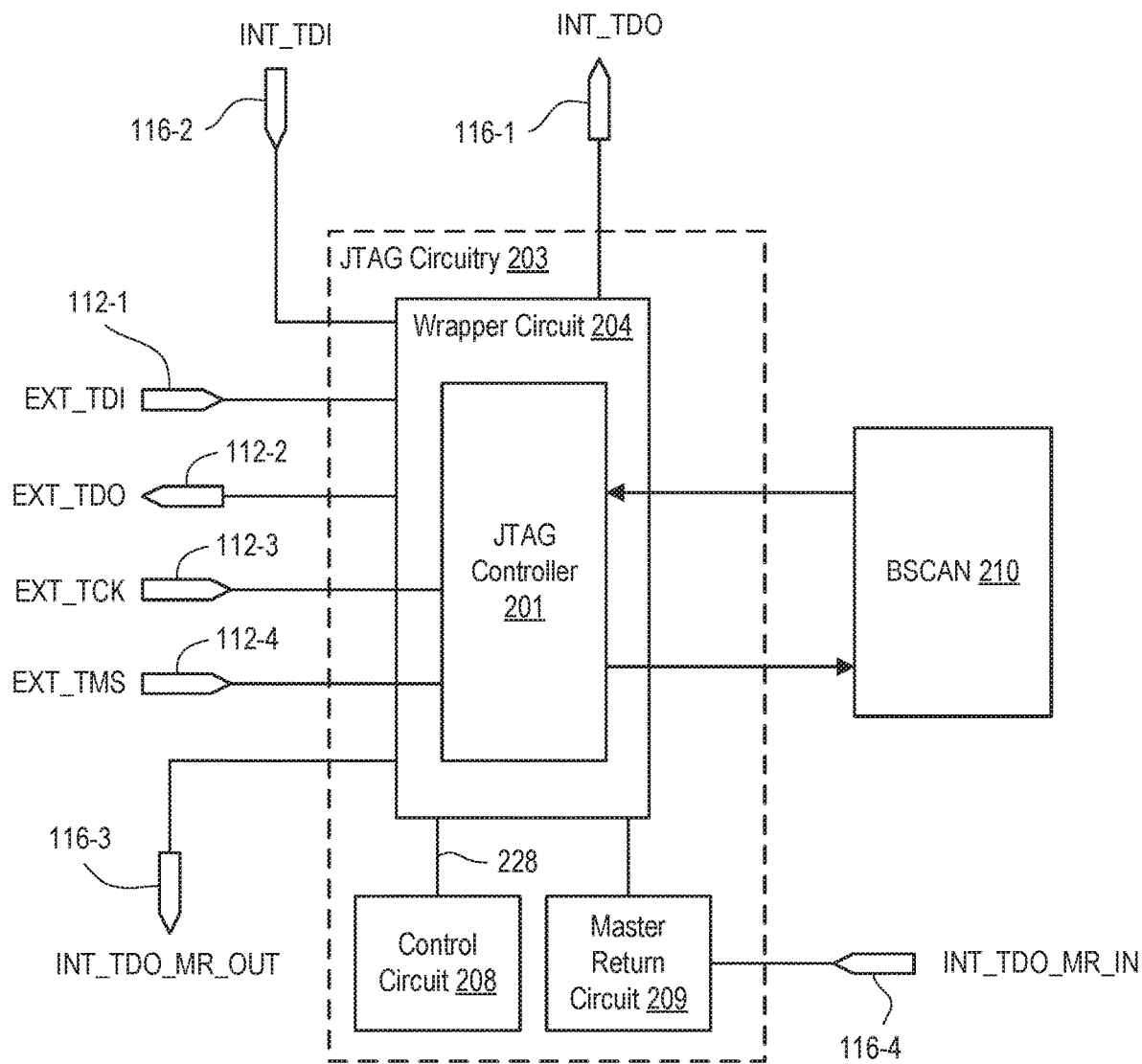
FIG. 2 is a block diagram depicting JTAG circuitry according to an example.

FIG. 2 is a block diagram depicting JTAG circuitry 203 according to an example. The JTAG circuitry 203 includes a wrapper circuit 204, a JTAG controller 201, a control circuit 208, and a master return circuit 209. EXT_TDI, EXT_TDO, INT_TDI, INT_TDO, and INT_TDO_MR_OUT are each coupled to the wrapper circuit 204. The wrapper circuit 204 passes EXT_TCK and EXT_TMS to the JTAG controller 201. The JTAG controller 201 is coupled to a boundary scan register (BSCAN 210) in the IC die 102. The wrapper circuit 204 receives control signals 228 from the control circuit 208. The wrapper circuit 204 is further coupled to the master return circuit 209. The master return circuit 209 provides an interface between INT_TDO_MR_IN and the wrapper circuit 204. The wrapper circuit 204 includes multiplexing logic, as described further below, that is controlled by the control circuit 208.

Figure 3:
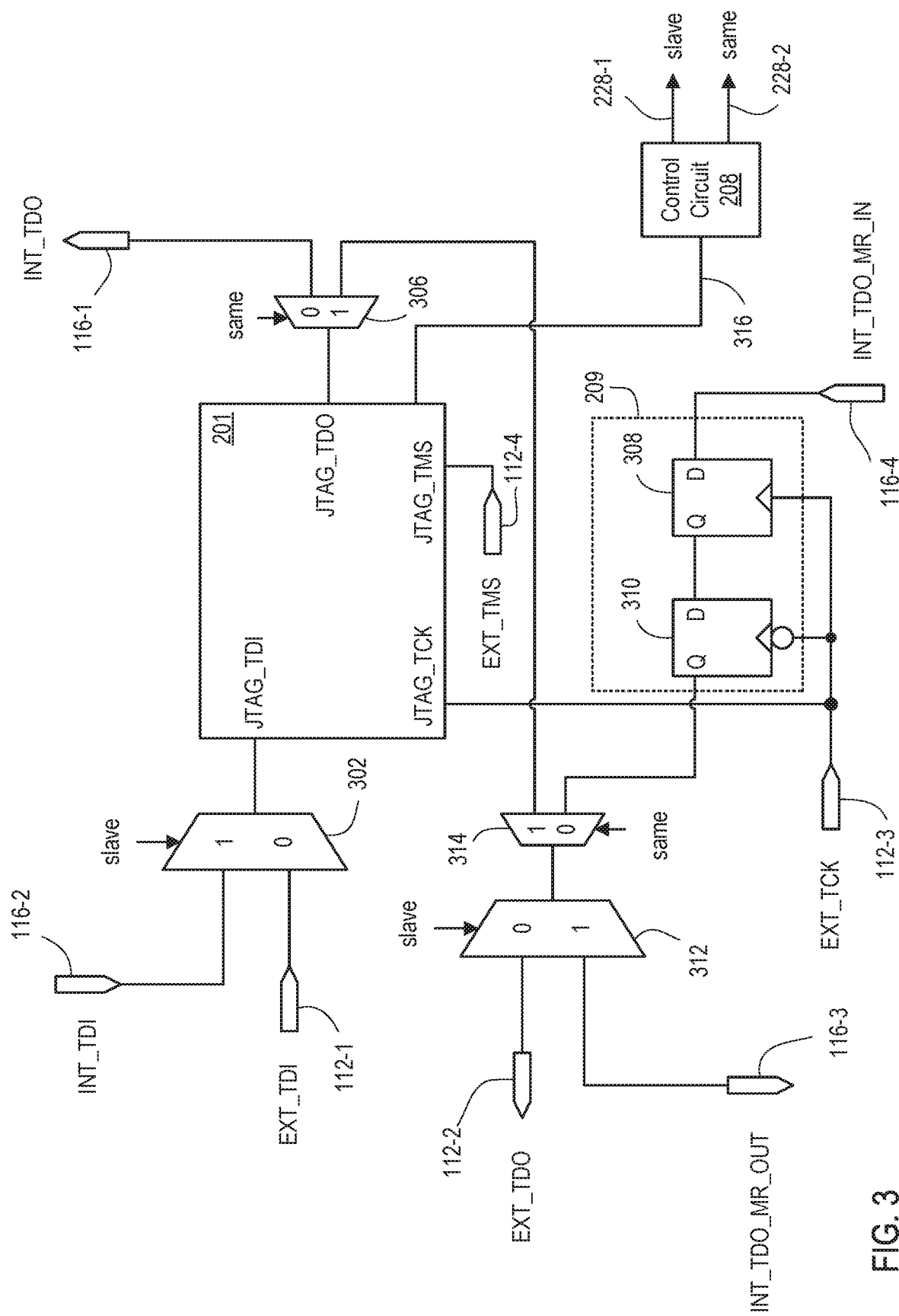
FIG. 3 is a block diagram depicting a wrapper circuit as coupled to a JTAG controller, a master return circuit, and a control circuit according to an example.

FIG. 3 is a block diagram depicting a wrapper circuit 204 as coupled to a JTAG controller 201, a master return circuit 209, and a control circuit 208 according to an example. The wrapper circuit 204 includes multiplexers 302 and 314, demultiplexers 306 and 312. The multiplexer 302 includes a first input ("0" input) coupled to EXT_TDI, a second input ("1" input) coupled to INT_TDI, and an output coupled to JTAG_TDI of the JTAG controller 201. The demultiplexer 306 includes an input coupled to JTAG_TDO of the JTAG controller 201, a first output ("0" output) coupled to INT_TDO, and a second output ("1" output) coupled to a second input ("1" input) of the multiplexer 314. The multiplexer 314 includes a first input ("0" input) coupled to an output of the master return circuit 209, the second input described above, and an output coupled to an input of the demultiplexer 312. The demultiplexer 312 includes a first output ("0" output) coupled to EXT_TDO and a second output ("1" output) coupled to INT_TDO_MR_OUT.

In an example, the master return circuit 209 includes a flip-flop 308 and a falling-edge flip-flop 310. As used herein, a "falling-edge" flip-flop loads data at the input on each falling edge of the applied clock signal, as opposed to each leading edge of the clock signal. A falling-edge flip-flop is indicated in the drawings by a bubble at the clock port. An input (D) of the flip-flop 308 is coupled to INT_TDO_MR_IN. An output (Q) of the flip-flop is coupled to an input (D) of the falling-edge flip-flop 310. An output (Q) of the falling-edge flip-flop 310 is coupled to the first input (0) of the multiplexer 314. The clock ports of the flip-flop 308 and the falling-edge flip-flop 310 are coupled to EXT_TCK.

The control circuit 208 includes an input 316 coupled to an output of the JTAG controller 201. The control circuit 208 generates control signals 228-1 and 228-2, referred to as slave and same, respectively. The control signal 228-1 is coupled to control ports of the multiplexer 302 and the demultiplexer 312. The control signal 228-2 is coupled to control ports of the demultiplexer 306 and the multiplexer 314.

Figure 4:
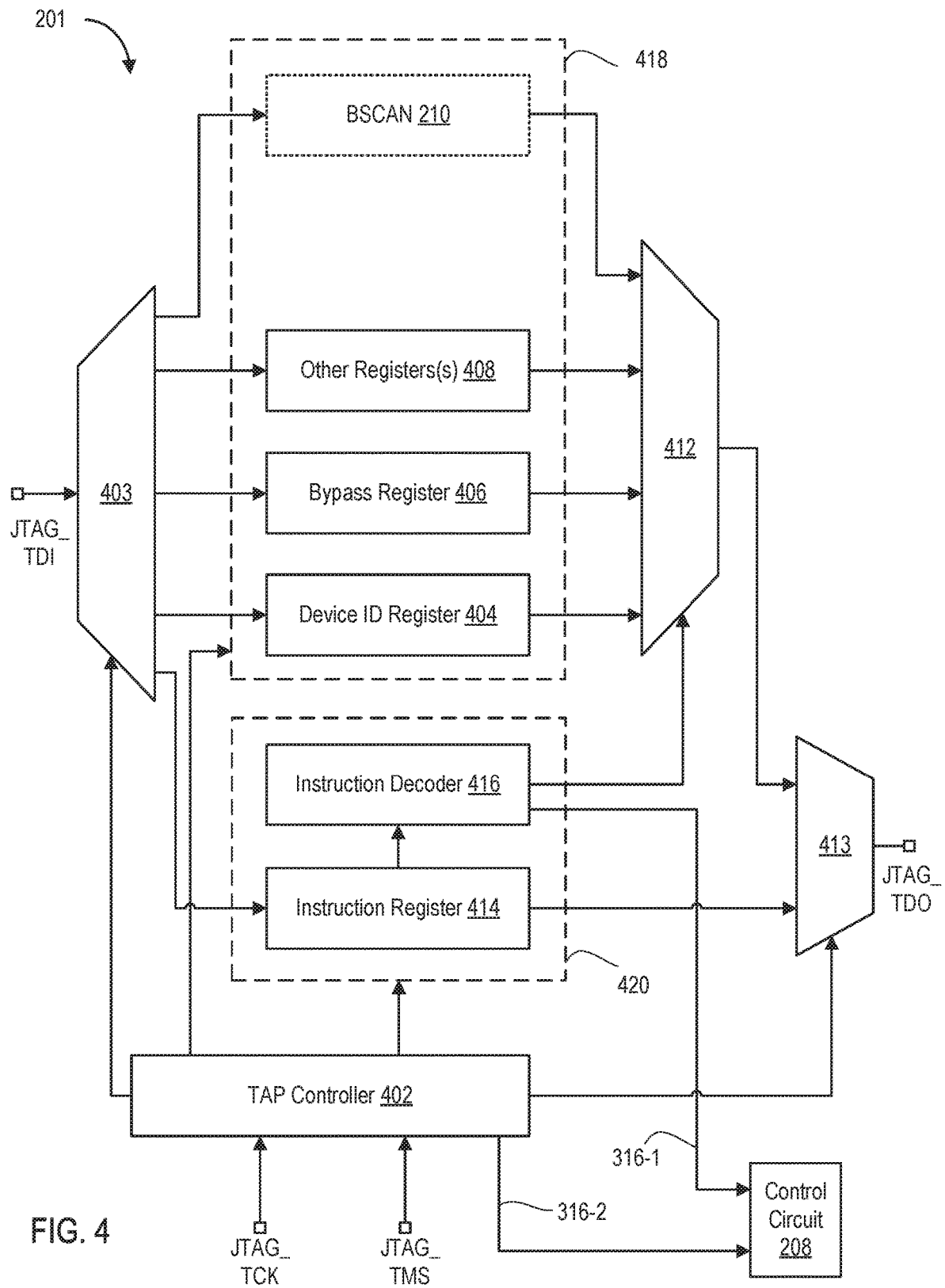
FIG. 4 is a block diagram depicting a JTAG controller according to an example.

FIG. 4 is a block diagram depicting a JTAG controller 201 according to an example. The BSCAN register 210 is shown for clarity and is not part of the JTAG controller 201, but rather distributed throughout the input/outputs of the IC die 102. The JTAG controller 201 includes a TAP controller 402, instruction logic 420, a device ID register 404, a bypass register 406, other register(s) 408, a demultiplexer 403, a multiplexer 412, and a multiplexer 413. The instruction logic 420 includes instruction register 414 and instruction decoder 416. The device ID register 404, a bypass register 406, and other register(s) 408 together with the BSCAN register 210 comprise data logic 418.

JTAG_TDI is coupled to an input of the demultiplexer 403. Outputs of the demultiplexer 403 are coupled to inputs of the BSCAN register 210, the other register(s) 408, the bypass register 406, the device ID register 404, and the instruction register 414. Outputs of the BSCAN register 210, the other register(s) 408, the bypass register 406, and the device ID register 404 are coupled to inputs of the multiplexer 412. An output of the multiplexer 412 is coupled to a first input of the multiplexer 413. A first output of the instruction register 414 is coupled to a second input of the multiplexer 413. A second output of the instruction register 414 is coupled to an input of the instruction decoder 416. An output of the multiplexer 413 is coupled to the JTAG_TDO.

A first output of the instruction decoder 416 is coupled to a control input of the multiplexer 412. A second output of the instruction decoder 416 is coupled to a first input 316-1 of the control circuit 208. Inputs of the TAP controller 402 are coupled to JTAG_TCK and JTAG_TMS. A first output of the TAP controller 402 is coupled to an input 316-2 of the control circuit 208. A second output of the TAP controller 402 is coupled to the instruction logic 420. A third output of the TAP controller 402 is coupled to the data logic 418. A fourth output of the TAP controller 402 is coupled to a control input of the demultiplexer 403.

In operation, the TAP controller 402 implements a state machine having a plurality of states that control setting and retrieving information from a selected register. Transitions between states of the TAP controller 402 are controlled by the JTAG_TMS signal sampled according to the JTAG_TCK signal. The demultiplexer 403 selectively couples the JTAG_TDI to an input of one of the registers, and the multiplexer 412 selectively couples an output of one of the data registers to an input of the multiplexer 413. The multiplexer 413 then selects either an output of one of the data registers or the output of the instruction register 414. The TAP controller 402 controls the demultiplexer 403 and the multiplexer 413 based on the phase (instruction phase or data phase). The instruction decoder 416 controls the multiplexer 412 based on the current instruction. The states of the TAP controller 402 are described in detail in the IEEE 1149.1 standard and are well-known. In particular, the TAP controller 402 includes a shift data state, which controls when data is shifted into one of the data registers. Serial data transfers occur when the shift data state is in an active logic state (e.g., active logic low according to IEEE 1149.1). The bypass register 406 is typically a 1-bit register that allows information on the JTAG bus intended for another device to bypass the JTAG controller of a prior device. The device ID register 404 can store an identifier for the device. The structure of the JTAG controller 201 shown in FIG. 4 is just one example structure. Those skilled in the art will appreciate that the techniques described herein can be employed with JTAG controllers having other structures.

Figure 5:
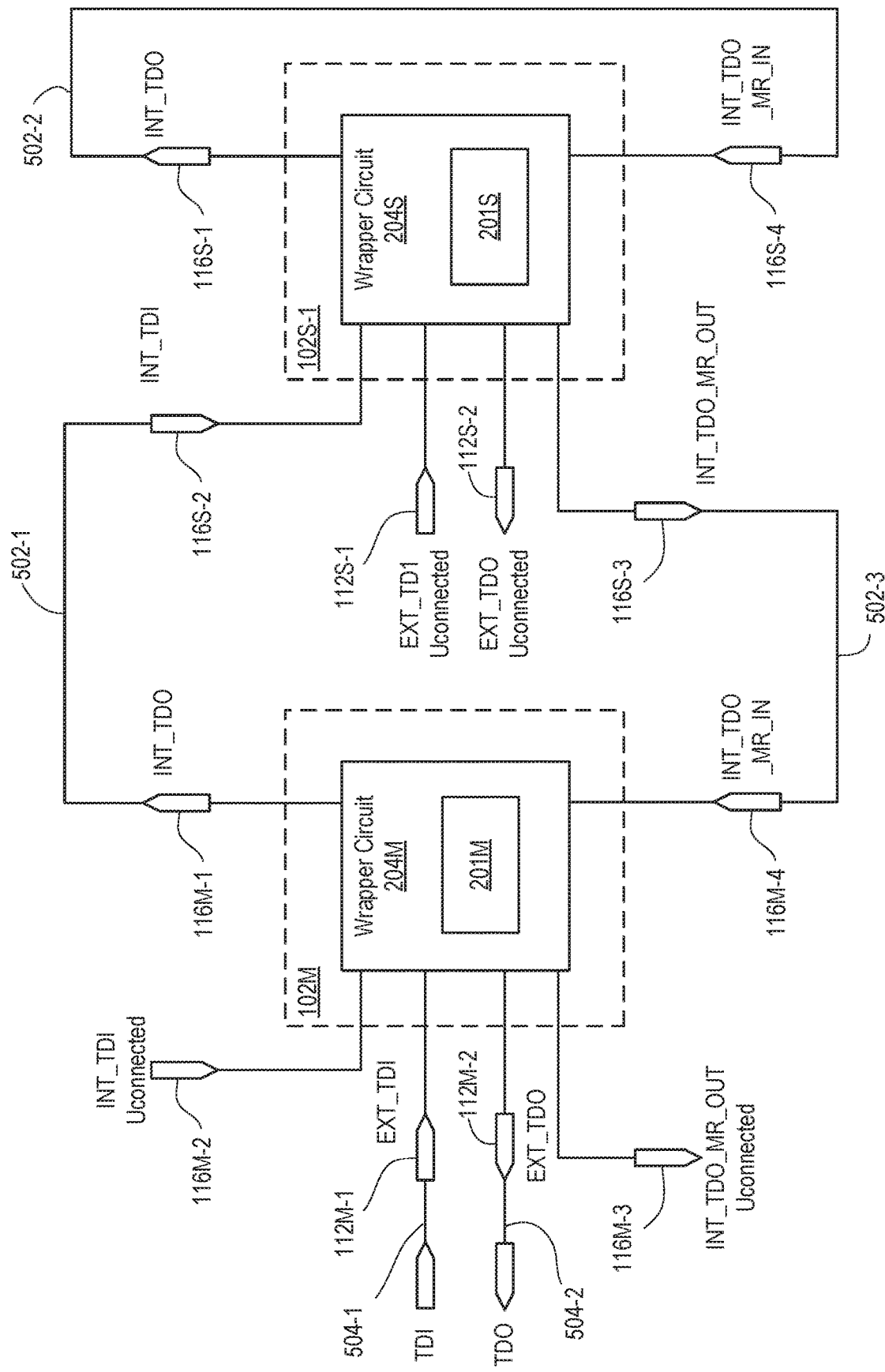
FIG. 5 is a block diagram depicting a master IC die coupled to a slave IC die according to an example.

FIG. 5 is a block diagram depicting the master IC die 102M coupled to the slave IC die 102S-1 according to an example. In the example of FIG. 5, the slave IC die(s) 102S include only the slave IC die 102S-1. The master IC die 102M includes a master wrapper circuit 204M and a master JTAG controller 201M. The slave IC die 102S-1 includes a slave wrapper circuit 204S and a slave JTAG controller 201S. In FIG. 5, reference characters having the suffix "M" are associated with the master IC die 102M, and reference characters having the suffix "S" are associated with the slave IC die 102S.

With reference to FIGS. 3-5, the master IC die 102M is configured as a master. The control circuit 208 in master IC die 102M sets the slave signal to select "0" so that multiplexer 302 selects EXT_TDI (112M-1) and demultiplexer 312 selects EXT_TDO (112M-2). The multi-die IC package 104 includes routing 504-1 that couples EXT_TDI to TDI of the TAP 106, and routing 504-2 that couples EXT_TDO to TDO of the TAP 106. As discussed above, TMS and TCK of the TAP 106 is coupled to EXT_TMS and EXT_TCK of each IC die 102 and are omitted from FIG. 5 for clarity. Since the control circuit 208 sets the signal slave to logic "0", the master wrapper circuit 204M couples EXT_TDI to JTAG_TDI of the master JTAG controller 201M. INT_TDI (116M-2) and INT_TDO_MR_OUT (116M-3) of the master IC die 102M are unconnected within multi-die IC package 104 (e.g., high-impedance).

The multi-die IC package 104 includes routing 502-1 that couples INT_TDO (116M-1) of the master IC die 102M to INT_TDI (116S-2) of the slave IC die 102S-1. The slave IC die 102S-1 is configured as a slave. The control circuit 208 in slave IC die 102S-1 sets the slave signal to select "1" so that multiplexer 302 selects INT_TDI and demultiplexer 312 selects INT_TDO_MR_OUT. EXT_TDI (112S-1) and EXT_TDO (112S-2) of slave IC die 102S-1 are unconnected within multi-die IC package 104 (e.g., high-impedance). The multi-die IC package 104 includes routing 502-2 that couples INT_TDO (116S-1) of the slave IC die 102S-1 to INT_TDO_MR_IN (116S-4) of the slave IC die 102S-1. That is, the multi-die IC package 104 couples the forwarding path 108 to the master return path 110 after the slave IC die 102S-1 (since the slave IC die 102S-1 is the last slave in the chain).

Since slave IC die 102S-1 is configured as a slave, the control circuit 208 sets the signal "same" to select "0" so that the demultiplexer 306 couples JTAG_TDO of the slave JTAG controller 201S to INT_TDO (116S-1) and the multiplexer 314 couples the output (Q) of the falling-edge flip-flop 310 to the demultiplexer 312. Since the control circuit 208 sets the signal slave to logic "1", the demultiplexer 312 selects INT_TDO_MR_OUT (116S-3). Thus, the master return circuit 209 of the master return path 110 is coupled to INT_TDO_MR_OUT (116S-3) of the slave IC die 102S-1.

The multi-die IC package 104 includes routing 502-3 that couples INT_TDO_MR_OUT (116S-3) of the slave IC die 102S-1 to INT_TDO_MR_IN (116M-4) of the master IC die 102M. This connects the master return circuit 209 of the master IC die 102M to the master return path 110. The control circuit 208 in the master IC die 102M sets the state of the signal "same" dynamically according to the instruction loaded to instruction register 414 in the master JTAG controller 201M. If the instruction is of a type that requires JTAG data to only be shifted through the master IC die 102M, the control circuit 208 sets the signal "same" to logic "1" (e.g., BYPASS, IDCODE). If the instruction is of a type that requires JTAG data to be shifted through both the master IC die 102M and the slave IC die 102S-1, the control circuit 208 sets the signal "same" to logic "0" (e.g., EXTEST, SAMPLE/PRELOAD).

When the signal "same" is set to logic "0", the demultiplexer 306 couples the JTAG_TDO of the master JTAG controller 201M to INT_TDO (116M-1) of the master IC die 102M. Also, the multiplexer 314 couples the output (Q) of the falling-edge flip-flop 310 to the input of the demultiplexer 312. As the master IC die 102M is configured as a master, the demultiplexer 312 couples the output of the multiplexer 314 to EXT_TDO (112M-2), which is coupled to TDO of the TAP 106 by the routing 504-2. Thus, when the signal "same" is set to logic "0", the master wrapper circuit 204M couples the JTAG_TDO of the master JTAG controller 201M to the forwarding path 108 and couples the master return path 110 to EXT_TDO of the master IC die 102M.

When the signal "same" is set to logic "1", the demultiplexer 306 couples the JTAG_TDO of the master JTAG controller 201M to the input ("1") of the multiplexer 314. That is, the JTAG_TDO of the master JTAG controller 201M is disconnected from INT_TDO (116M-1) and the forwarding path 108. The multiplexer 314 couples the JTAG_TDO of the master JTAG controller 201M to the input of the demultiplexer 312, which in the master IC die 102M is selecting EXT_TDO (112M-2). Thus, when the signal "same" is set to logic "1", the master wrapper circuit 204M couples the JTAG_TDO of the master JTAG controller 201M to EXT_TDO (112M-2), which in turn is coupled to TDO of the TAP 106. In such case, the master IC die 102M is disconnected from the forwarding path 108 and the master return path 110.

Table 1 shows a truth table for the control circuit 208 in an IC die 102.

TABLE 1

| Slave | Instruction same? | Same |
|---|---|---|
| 0 | 0 | 0 |
| 0 | 1 | 1 |
| 1 | X | 0 |

In summary, if the IC die 102 is configured as a slave, then the signal "slave" is set to logic "1" (true) and the signal "same" is set to logic "0" (false) regardless of the instruction type. Thus, a slave IC die 102S is always configured to couple the JTAG_TDO of its JTAG controller 201 to the forwarding path 108 and its master return circuit 209 to the master return path 110. If the IC die 102 is configured as a master, then its control circuit 208 performs dynamic routing to EXT_TDO based on the type of instruction. If the instruction is the type indicating the same die (e.g., JTAG data only for master IC die 102M), then the control circuit 208 sets the signal "same" to logic "1" (true). Otherwise, the control circuit 208 sets the signal "same" to logic "0" (false).

The control circuit 208 receives information of the type of instruction from the instruction decoder 416. Based on the result of the instruction decoder 416, the control circuit 208 sets the state of the signal "same" to route the JTAG data as required (either only in the master or to the entire chain). Instruction data is routed to all IC die 102 on the chain. Thus, control circuit 208 in the master IC die 102M initially sets the signal "same" to logic "0" (false). Once the instruction is decoded, the control circuit 208M in the master IC die 102M can change the state of the signal "same" to be "1" (true) (e.g., for a BYPASS instruction). After the instruction is executed, the control circuit 208 in the master IC die 102M resets the signal "same" to logic "0" (false) for the next instruction. The control circuit 208 can reset the signal "same" to logic "0" (false) based on output from the TAP controller 402, which indicates the previous instruction has been completed.

In the examples described, the control circuit 208 is external to the JTAG controller 201. In other examples, a portion of the control circuit 208 can be incorporated into the JTAG controller 201. For example, the functionality of the control circuit 208 with respect to the signal "same" can be implemented in the instruction decoder 416. In such case, the JTAG controller 201 can output the signal "same" for use by the wrapper circuit 204. The IC die 102 in the multi-die IC package 104 are disposed in a fixed configuration with respect to which die is the master and which die is/are the slave(s). In such case, the signal "slave" is a fixed value for the master IC die 102M and each slave IC die 102S. In examples, the signal "slave" can be generated by a nonvolatile memory element (e.g., e-fuse or the like).

FIG. 6A illustrates a side-view of a multi-die IC package 104 according to an example. The multi-die IC package 104 includes a substrate 602 (e.g., an interposer or package substrate) having a plurality of contacts 608 on one side, and one or more layers of routing 604 on the opposite side. The substrate 602 includes vias 606 that couple the contacts 608 to the routing 604. IC die 102 are attached to the substrate 602 in electrical communication with the routing 604 through contacts 610. In the example, the multi-die IC package 104 includes a master IC die 102M and a slave IC die 102S-1. The routing 502 and 504 shown in FIG. 5 is implemented in the routing 604 of the substrate 602. The contacts 610 include contacts for the interface 112 and the interface 116 of each IC die 102. As noted above, some contacts of the interface 112 or the interface 116 can be unconnected depending on the master/slave configuration of the IC die 102. The contacts 608 include contacts for the TAP 106.

FIG. 6B illustrates a side-view of a multi-die IC package 104 according to another example. In this example, the multi-die IC package 104 includes a substrate 614 (e.g., an interposer or package substrate) having a plurality of contacts 616 on one side, and one or more layers of routing 620 on the opposite side. The substrate 614 includes vias 618 that couple the contacts 616 to the routing 620. An IC die 102 (e.g., the master IC die 102M) is attached to the substrate 614 in electrical communication with the routing 620 through contacts 622. The master IC die 102M includes layers of routing 626 electrically coupled to the contacts 622 through vias 624. Another IC die 102 (e.g., the slave IC die 102S-1) is mounted on top of the master IC die 102M. The slave IC die 102S-1 includes layers of routing 628 facing the routing 626 of the master IC die 102M. This is referred to as an "active-on-active" configuration. The routing 628 is electrically connected to the routing 626 by contacts 630. The routing 502 shown in FIG. 5 can be implemented using the routing 626, the contacts 630, and the routing 628. The routing 504 shown in FIG. 5 can be implemented using the contacts 622, the vias 624, and the routing 626. The contacts 616 include contacts for the TAP 106.

Figure 7:
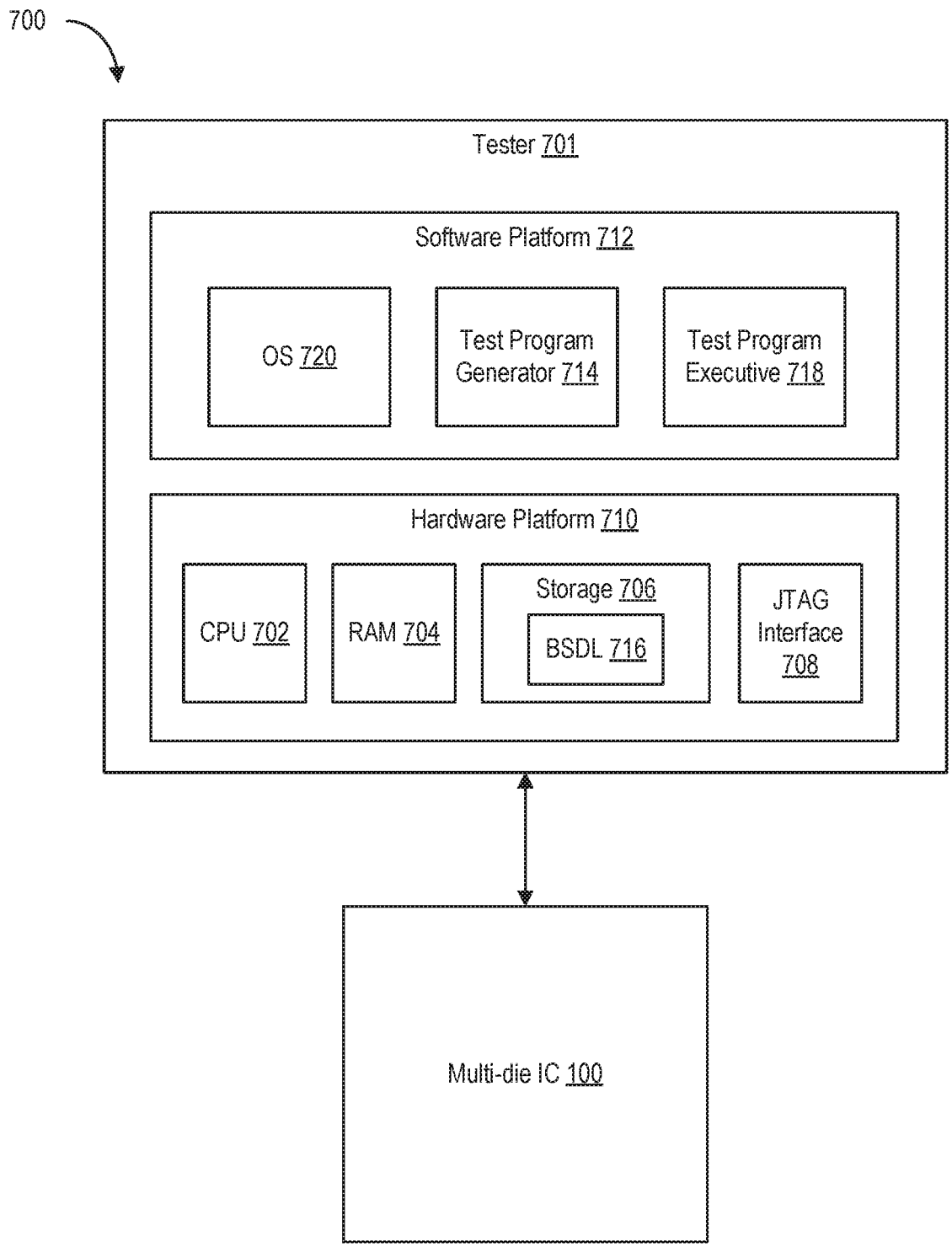
FIG. 7 is a block diagram depicting an IC test system according to an example.

FIG. 7 is a block diagram depicting an IC test system 700 according to an example. The IC test system 700 includes a tester 701 having a hardware platform 710 and a software platform 712. As shown, the hardware platform 710 includes conventional components of a computing device, such as one or more central processing units (CPUs) 702, system memory (e.g., random access memory (RAM) 704), storage 706, and a JTAG interface 708. The CPUs 702 are configured to execute instructions, for example, executable instructions that perform one or more operations described herein, which may be stored in the RAM 704. The storage 706 can store files, such as one or more boundary scan description language (BSDL) files 716. The JTAG interface 708 is coupled to the multi-die IC device 100. The software platform 712 includes an operating system (OS) 720, a test program generator 714, and a test program executive 718. The OS 720 can be any operating system known in the art. The test program generator 714 accepts computer aided design (CAD) data as input in the form of a netlist, bill of materials, schematic, layout information, and the like or any combination thereof. The test program generator 714 uses the CAD data to generate test patterns for fault detection and isolation using JTAG. The test program executive 718 interfaces with the multi-die IC device 100, executes the tests, and compares the results to expected values. The test program generator 714 and/or the test program executive 718 can consume the BSDL files 716. A BSDL file 716 describes the boundary scan behavior of the device, including what JTAG standards are supported, signal mapping and package information, available instructions and which registers those instructions access, the type of boundary scan cell available for each signal, and the like.

As described above, the shift instruction register state (e.g., loading an instruction) is treated as a "next die" instruction (e.g., the signal "same" is logic "0" or false). This maintains a constant instruction register length for the multi-die IC package 104. In the instruction phase, the flip-flops on the master return path 110 used for retiming must be accounted for when specifying the instruction.

Within a single IC die 102, the instruction register can be 6-bits in length, for example. Since the multi-die IC package 104 includes multiple IC die 102, the instruction register length increases by 7 bits for each added IC die 102 (6 instruction bits and 1 return path bit) plus one additional bit for the return flip-flop in the master return circuit. The instruction register order for a master IC die 102M and one slave IC die 102S-1 is: TDI→6-bit (master instruction register)→6-bit (slave instruction register)→1-bit (slave return flop)→1-bit (master return flop)→TDO. The total instruction register length in this example is 14 bits.

The JTAG instruction decodes are extended to account for the extra bits. For example, the IDCODE instruction for just one IC die is 6'h09 (6'b001001). In the notation, the first number (e.g., 6) indicates the number of bits, the next letter (e.g., h orb) indicates hexadecimal or binary, and remaining portion indicates the value. The IDCODE instruction for the multi-die IC package 104 having one master IC die 102M and one slave IC die 102S is 14'h927, where the instruction is formatted as follows:

IDCODE=14'h927 (14'b001001_001001_1_1)
Master instruction register=6'h09 (6'b001001)
Slave instruction register=6'h09 (6'b001001)
Slave return=1'h1 (1'b1)
Master return=1'h1 (1'b1)

Since the IDCODE instruction is a "same" die instruction, the code loaded into the slave instruction register does not matter, as the data will never shift through the slave IC die 102S. It is described as 6'h09 by way of example but could in practice be any value. The instruction register length for a multi-die IC package 104 is described in a BSDL file 716 for the device.

Figure 8:
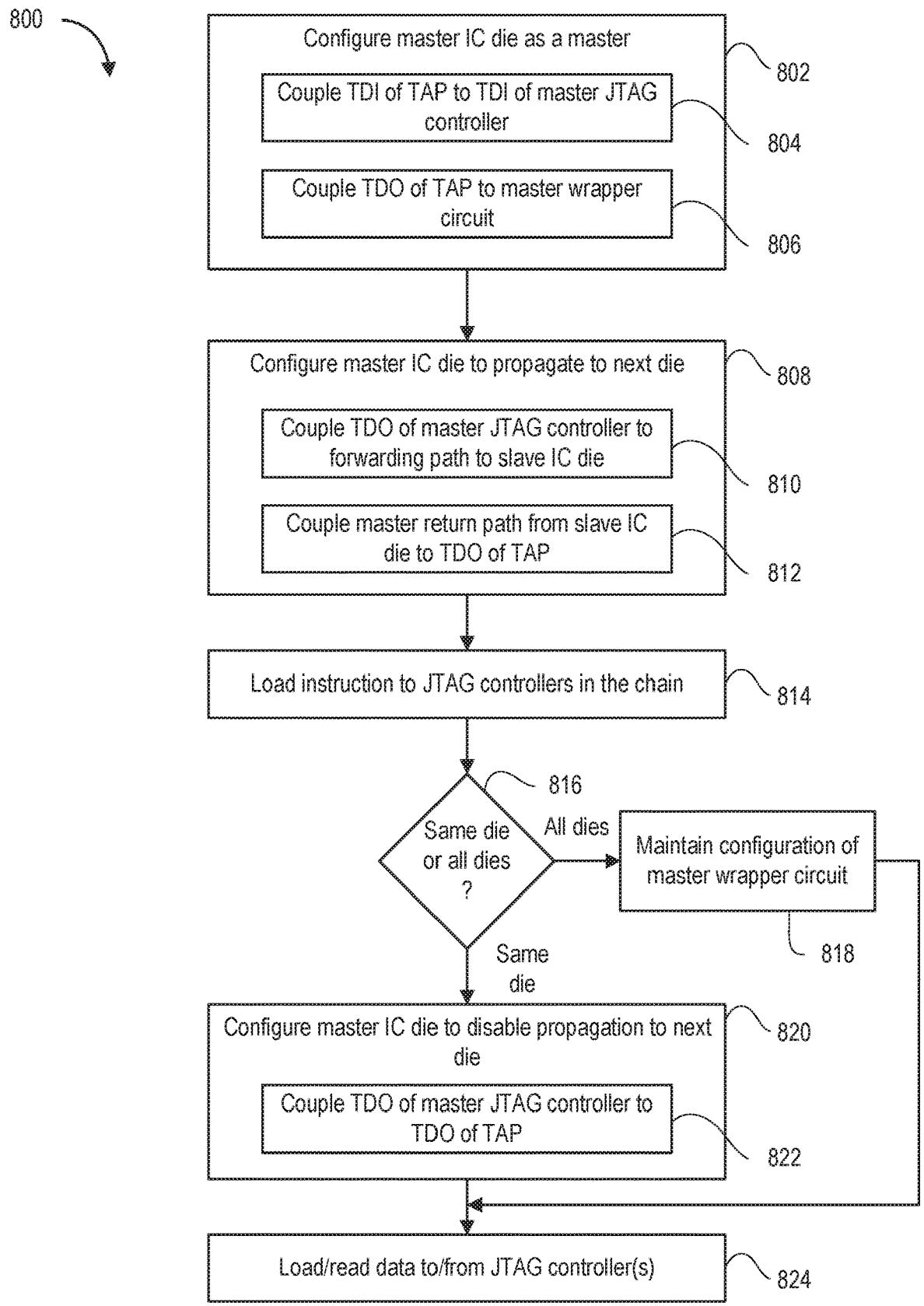
FIG. 8 is a flow diagram depicting a method of operation of a master IC die during testing a multi-die IC package according to an example.
Figure 9:
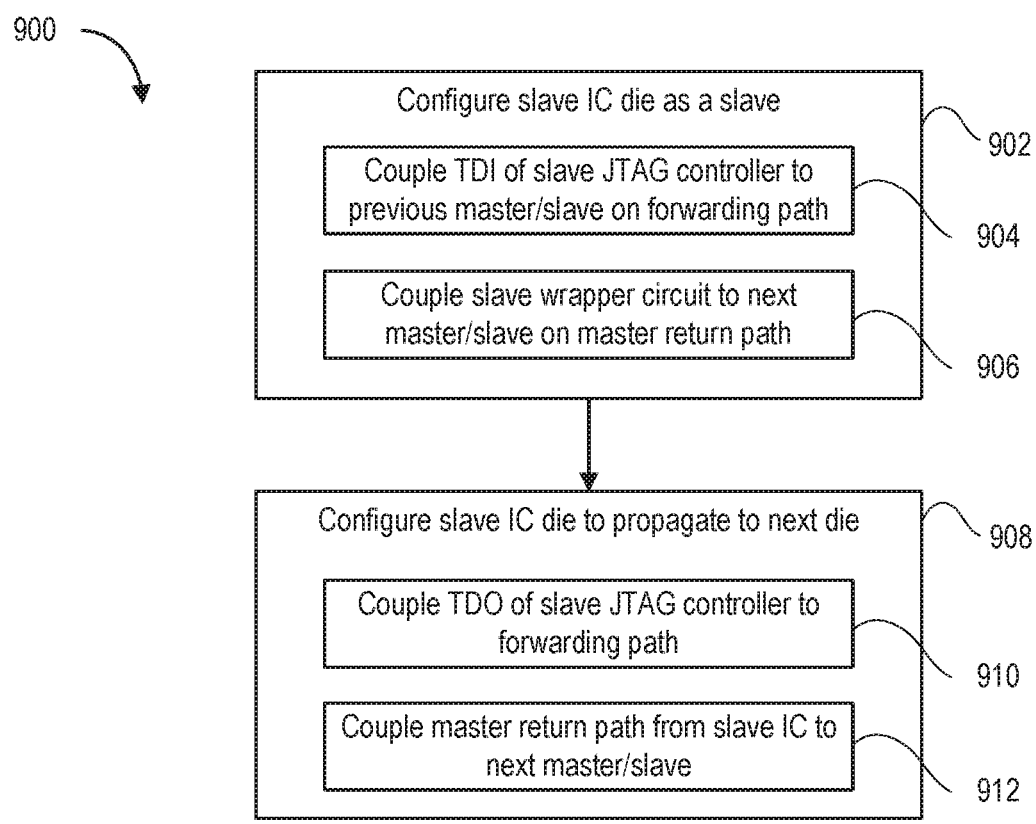
FIG. 9 is a flow diagram depicting a method of operation of a slave IC die during testing a multi-die IC package according to an example.

FIGS. 8-9 are flow diagrams depicting a method of testing a multi-die IC package 104 according to an example. FIG. 8 shows a method 800 for operating the master IC die 102M during the testing. FIG. 9 shows a method for operating a slave IC die 102S during the testing.

The method 800 begins at step 802, where the master IC die 102M configures itself as a master. The master wrapper circuit 204M in the master IC die 102M couples the TDI of the TAP 106 (through EXT_TDI) to the JTAG_TDI of the master JTAG controller 201M (804). The master wrapper circuit 204M couples the TDO of the TAP 106 (through EXT_TDO) to itself (806). The step 802 (including 804 and 806) can be performed upon powering up the master IC die 102M and remain static throughout operation of the master IC die 102M.

At step 808, the control circuit 208 in the master IC die 102M configures the master wrapper circuit 204M to propagate JTAG data to the next die (e.g., the signal "same" is set to logic "0" in the master IC die 102M). The JTAG_TDO of the master JTAG controller 201M is coupled to the forwarding path 108 (810). The master return path 110 is coupled to the TDO of the TAP 106 (through the master wrapper circuit 204M and EXT_TDO) (812). At step 814, the JTAG controllers 201 in the multi-die IC package 104 receive the instruction formatted as described above.

At step 816, the control circuit 208 in the master IC die 102M determines if the instruction is for same die or all dies. If the instruction is for all dies, the method 800 proceeds to step 818, where the control circuit 208 maintains the state of the signal "same" (as logic "0" or false) and the configuration of the master wrapper circuit 204M stays the same (connecting the forwarding path 108 and the master return path 110). If the instruction is for the same die, the method 800 proceeds to step 820. At step 820, the control circuit 208 in the master IC die 102M sets the signal "same" to logic "1" (true) to disable propagation of JTAG data to the next die. The master wrapper circuit 204M couples the JTAG_TDO of the master JTAG controller 201M to the TDO of the TAP 106, disconnecting the forwarding path 108 and the master return path 110 (822). At step 824, a tester loads/reads data to/from the JTAG controller(s) in the multi-die IC package 104.

Referring to FIG. 9, the method 900 begins at step 902. At step 902, the slave IC die 102S configures itself as a slave. The JTAG_TDI of the slave JTAG controller 201S is coupled to a previous master/slave on the forwarding path 108 (904). The slave wrapper circuit 204S couples itself to the next master/slave on the master return path 110 (906). The step 902 (including 904 and 906) can be performed upon powering up the slave IC die 102S and remain static throughout operation of the slave IC die 102S.

At step 908, the control circuit 208 in the slave IC die 102S configures the slave wrapper circuit 204S to propagate to the next die. The control circuit 208 in the slave IC die 102S sets the signal "same" to "0" (false). The slave wrapper circuit 204S couples the JTAG_TDO of the slave JTAG controller 201S to the forwarding path 108 (910). The slave wrapper circuit 204S couples the master return circuit 209 to the master return circuit of the next master/slave (912).

The JTAG circuitry 203 shown in FIG. 2 can be used in a programmable device, such as that shown in FIGS. 10A-10C below.

Figure 10A:
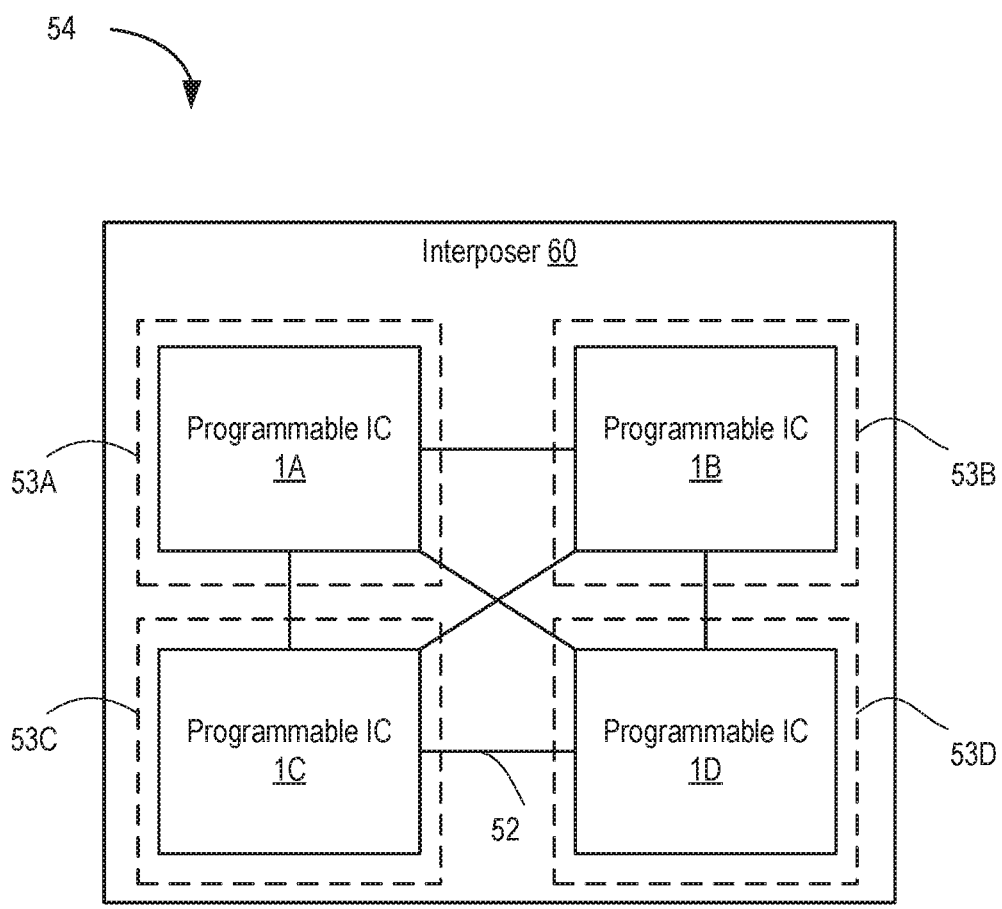
FIG. 10A is a block diagram depicting a programmable device according to an example.

FIG. 10A is a block diagram depicting a programmable device 54 according to an example. The programmable device 54 includes a plurality of programmable integrated circuits (ICs) 1, e.g., programmable ICs 1A, 1B, 1C, and 1D. In an example, each programmable IC 1 is an IC die disposed on an interposer 60. Each programmable IC 1 comprises a super logic region (SLR) 53 of the programmable device 54, e.g., SLRs 53A, 53B, 53C, and 53D. The programmable ICs 1 are interconnected through conductors on the interposer 60 (referred to as super long lines (SLLs) 52). The JTAG circuitry 203 can be disposed in each programmable IC 1, where one of the programmable IC 1 is configured as master and the remaining programmable IC 1 is/are configured as slave(s).

Figure 10B:
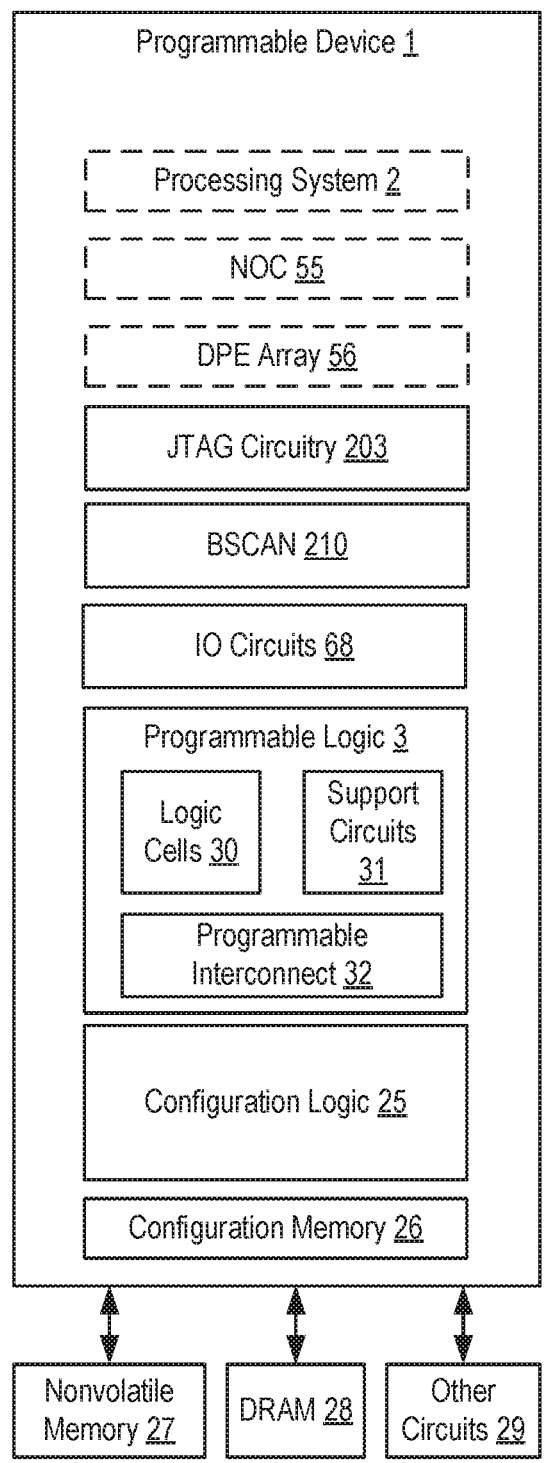
FIG. 10B is a block diagram depicting a programmable IC according to an example.

FIG. 10B is a block diagram depicting a programmable IC 1 according to an example. The programmable IC 1 can be used to implement one of the programmable ICs 1A-1D in the programmable device 54. The programmable IC 1 includes programmable logic (PL) 3 (also referred to as a programmable fabric), configuration logic 25, and configuration memory 26. The programmable IC 1 can be coupled to external circuits, such as nonvolatile memory 27, DRAM 28, and other circuits 29. The PL 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system (PS) 2. The PS 2 can include microprocessor(s), memory, support circuits, 10 circuits, and the like. In some examples, the programmable IC 1 includes a network-on-chip (NOC) 55 and data processing engine (DPE) array 56. The NOC 55 is configured to provide for communication between subsystems of the programmable IC 1, such as between the PS 2, the PL 3, and the DPE array 56. The DPE array 56 can include an array of DPE's configured to perform data processing, such as an array of vector processors. The programmable IC 1 can include a BSCAN register 210 coupled to the JTAG circuitry 203, described above.

Figure 10C:
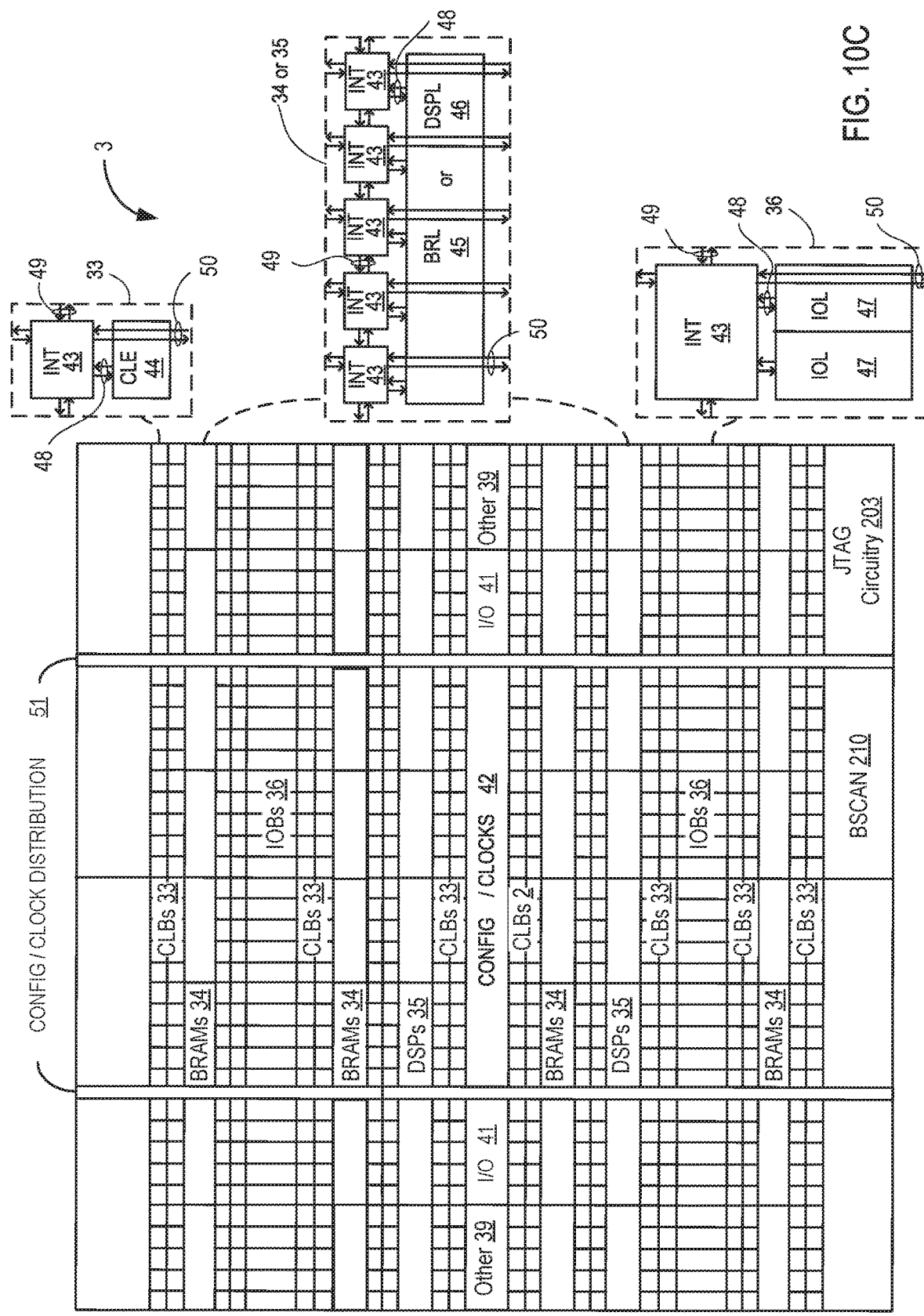
FIG. 10C illustrates a field programmable gate array (FPGA) implementation of the programmable IC of FIG. 10B that includes the programmable logic thereof according to an example.

FIG. 10C illustrates a field programmable gate array (FPGA) implementation of the programmable IC 1 that includes the PL 3. The PL 3 shown in FIG. 10C can be used in any example of the programmable devices described herein. The PL 3 includes a large number of different programmable tiles including configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. In examples, the programmable IC 1 can include a BSCAN register 210 coupled to the JTAG circuitry 203, described above.

In some PLs, each programmable tile can include at least one programmable interconnect element ("INT") 43 having connections to input and output terminals 48 of a programmable logic element within the same tile, as shown by examples included at the top of FIG. 10C. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated PL.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An 10B 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 3D) is used for configuration, clock, and other control logic. Vertical columns 51 extending from this horizontal area or column are used to distribute the clocks and configuration signals across the breadth of the PL.

Some PLs utilizing the architecture illustrated in FIG. 10C include additional logic blocks that disrupt the regular columnar structure making up a large part of the PL. The additional logic blocks can be programmable blocks and/or dedicated logic.

Note that FIG. 10C is intended to illustrate only an exemplary PL architecture. For example, the numbers of logic blocks in a row, the relative width of the rows, the number and order of rows, the types of logic blocks included in the rows, the relative sizes of the logic blocks, and the interconnect/logic implementations included at the top of FIG. 9C are purely exemplary. For example, in an actual PL more than one adjacent row of CLBs is typically included wherever the CLBs appear, to facilitate the efficient implementation of user logic, but the number of adjacent CLB rows varies with the overall size of the PL.

While the foregoing is directed to specific examples, other and further examples may be devised without departing from the basic scope thereof, and the scope thereof is determined by the claims that follow.

What is claimed is:

1. An integrated circuit (IC) package having a test access port (TAP) comprising a test data input (TDI), test data output (TDO), test clock (TCK), and test mode select (TMS), the IC package comprising:
   a master integrated circuit (IC) die including a master Joint Test Action Group (JTAG) controller and a master wrapper circuit coupled to the master JTAG controller, the master wrapper circuit comprising a first demultiplexer having an input coupled to a TDO of the master JTAG controller, and an output coupled to an output of the master wrapper circuit;
   a slave IC die including a slave JTAG controller and a slave wrapper circuit coupled to the slave JTAG controller;
   a forwarding path coupling the output of the master wrapper circuit to a first input of the slave wrapper circuit; and
   a master return path coupling a first output of the slave wrapper circuit to an input of the master wrapper circuit; and
   wherein the master wrapper circuit couples the TDI of the TAP to a TDI of the master JTAG controller, and selectively couples, based on a first control signal, the TDO of the TAP to either the master return path or the TDO of the master JTAG controller.

2. The IC package of claim 1, wherein the master wrapper circuit comprises:
   a first multiplexer having a first input coupled to the master return path, a second input coupled to a second output of the first demultiplexer, and an output coupled to the TDO of the TAP, and
   wherein control inputs of the first demultiplexer and the first multiplexer are coupled to receive the first control signal.

3. The IC package of claim 2, wherein the master wrapper circuit comprises:
   a second multiplexer having a first input coupled to the TDI of the TAP, a second input coupled to an unconnected input of the master IC die, and an output coupled to the TDI of the master JTAG controller; and
   a second demultiplexer having an input coupled to the output of the first multiplexer, a first output coupled to the TDO of the TAP, and a second output coupled to an unconnected output of the master IC die, and wherein control inputs of the second multiplexer and the second demultiplexer are coupled to a second control signal that selects the first input of the second multiplexer and the first output of the second demultiplexer.

4. The IC package of claim 1, wherein the slave wrapper circuit comprises:
a second demultiplexer having an input coupled to a TDO of the slave JTAG controller, and a first output coupled to a second output of the slave wrapper circuit; and
a first multiplexer having a first input coupled to the master return path, a second input coupled to a second output of the second demultiplexer, and an output coupled to a second output of the slave wrapper circuit, and
wherein control inputs of the second demultiplexer and the first multiplexer are coupled to receive the first control signal.

5. The IC package of claim 4, wherein the slave wrapper circuit comprises:
a second multiplexer having a first input coupled to an unconnected input of the slave IC die, a second input coupled to the first input of the slave wrapper circuit, and an output coupled to a TDI of the slave JTAG controller; and
a third demultiplexer having an input coupled to the output of the first multiplexer, a first output coupled to an unconnected output of the slave IC die, and a second output coupled to the first output of the slave wrapper circuit, and
wherein control inputs of the second multiplexer and the third demultiplexer are coupled to a second control signal that selects the second input of the second multiplexer and the second output of the third demultiplexer.

6. The IC package of claim 1, wherein the master return path includes a master return circuit in the master IC die and a master return circuit in the slave IC die, the master return circuits comprising a flip-flop coupled to a falling-edge flip-flop in the master return path.

7. The IC package of claim 1, wherein a TCK and a TMS of each of the master JTAG controller and the slave JTAG controller are coupled to the TCK and the TMS, respectively, of the TAP.

8. An integrated circuit (IC) die in a multi-die IC package, the multi-die IC package having a test access port (TAP) comprising a test data input (TDI), test data output (TDO), test clock (TCK), and test mode select (TMS), the IC die comprising:
a Joint Test Action Group (JTAG) controller having a JTAG interface that includes a TDI, a TDO, a TCK, and a TMS;
a first output coupled to a first routing in the multi-die IC package;
a first input coupled to the first routing or to a second routing in the multi-die IC package;
a master return path coupled to the first input; and
a wrapper circuit comprising a first demultiplexer having an input coupled to the TDO of the JTAG controller, and an output coupled to the first output, the wrapper circuit configured to couple the TDI of the TAP to the TDI of the JTAG controller, and selectively couple, based on a first control signal, the TDO of the TAP to either the master return path or the TDO of the JTAG controller.

9. The IC die of claim 8, wherein the wrapper circuit comprises:
a first multiplexer having a first input coupled to the master return path, a second input coupled to a second output of the first demultiplexer, and an output coupled to the TDO of the TAP, and
wherein control inputs of the first demultiplexer and the first multiplexer are coupled to receive the first control signal.

10. The IC die of claim 9, wherein the master return path includes a master return circuit, the master return circuit comprising a flip-flop coupled to a falling-edge flip-flop, an input of the flip-flop coupled to the first input, an output of the falling-edge flip-flop coupled to the first input of the first multiplexer.

11. The IC die of claim 9, further comprising:
a second input that is unconnected or coupled to third routing in the multi-die IC package; and
a second output that is unconnected or coupled to fourth routing in the multi-die IC package;
wherein the wrapper circuit comprises:
a second multiplexer having a first input coupled to the TDI of the TAP, a second input coupled to the second input, and an output coupled to the TDI of the JTAG controller; and
a second demultiplexer having an input coupled to the output of the first multiplexer, a first output coupled to the TDO of the TAP, and a second output coupled to the second output, and
wherein control inputs of the second multiplexer and the second demultiplexer are coupled to a second control signal.

12. The IC die of claim 8, further comprising:
a control circuit configured to generate the first control signal.

13. The IC die of claim 12, wherein the control circuit is coupled to an instruction decoder and a TAP controller in the JTAG controller, and wherein the control circuit is configured to set a state of the first control signal based on outputs of the instruction decoder and the TAP controller.

14. The IC die of claim 12, wherein the control circuit is disposed in an instruction decoder of the JTAG controller, the control circuit configured to set a state of the first control signal based on an instruction decoded by the instruction decoder and output supplied by a TAP controller of the JTAG controller.

15. The IC die of claim 8, wherein a TCK and a TMS of each of the JTAG controller are coupled to the TCK and the TMS, respectively, of the TAP.

16. A method of testing a multi-die integrated circuit (IC) package having a test access port (TAP) comprising a test data input (TDI), test data output (TDO), test clock (TCK), and test mode select (TMS), the multi-die IC package further including a master IC die and a slave IC die, the method comprising:
coupling, by a master wrapper circuit in the master IC die, based on a first control signal output by a first control circuit in the master IC die, the TDO of the TAP to a master return path from the slave IC die to the master IC die;
receiving an instruction at a master JTAG controller in the master IC die through the TDI of the TAP, and at a slave JTAG controller in the slave IC die through a forwarding path from the master IC die to the slave IC die;
determining, by the first control circuit, that the instruction requires data to be routed only through the master IC die and changing state of the first control signal; and coupling, by a first demultiplexer of the master wrapper circuit, based on the first control signal output by the first control circuit, the TDO of the TAP to a TDO of the master JTAG controller, wherein the first demultiplexer has an input coupled to the TDO of the master JTAG controller.

17. The method of claim 16, wherein the instruction comprises a BYPASS instruction or an IDCODE instruction.

18. The method of claim 16, wherein the master return path includes a master return circuit in each of the master IC die and the slave IC die, the master return circuit comprising a flip-flop coupled to a falling-edge flip-flop in the master return path.

19. The method of claim 16, further comprising:
coupling, by the master wrapper circuit, based on a second control signal output by the first control circuit, the TDI of the TAP to a TDI of the master JTAG controller.

20. The method of claim 16, further comprising:
coupling, by a slave wrapper circuit in the slave IC die, based on a first control signal output by a second control circuit in the slave IC die, the forwarding path to a TDI of the slave JTAG controller; and
coupling, by the slave wrapper circuit, based on the first control signal output by the second control circuit, the master return path to the master IC die.

* * * * *